United States Patent
Hirai

(10) Patent No.: US 8,228,223 B2
(45) Date of Patent: Jul. 24, 2012

(54) RESISTOR STRING DIGITAL-TO-ANALOG CONVERTER

(75) Inventor: Koji Hirai, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 25 days.

(21) Appl. No.: 12/967,229

(22) Filed: Dec. 14, 2010

(65) Prior Publication Data

US 2011/0140944 A1 Jun. 16, 2011

(30) Foreign Application Priority Data

Dec. 15, 2009 (JP) ................................. 2009-283840

(51) Int. Cl.
*H03M 1/36* (2006.01)
(52) U.S. Cl. ...................................... 341/159; 341/144
(58) Field of Classification Search ........... 341/140–160
See application file for complete search history.

(56) References Cited

U.S. PATENT DOCUMENTS

| | | | | |
|---|---|---|---|---|
| 6,252,534 B1 * | 6/2001 | Timko | ............................ | 341/154 |
| 6,433,717 B1 * | 8/2002 | Leung | ............................ | 341/144 |
| 6,617,989 B2 * | 9/2003 | Deak | ............................ | 341/144 |
| 6,642,877 B2 * | 11/2003 | Leung | ............................ | 341/144 |
| 6,778,122 B2 * | 8/2004 | Lien | ............................ | 341/154 |
| 6,914,547 B1 * | 7/2005 | Swaroop et al. | ............... | 341/144 |
| 7,259,706 B2 * | 8/2007 | Haurie et al. | ................. | 341/154 |
| 7,283,079 B2 * | 10/2007 | Jain | ............................ | 341/154 |
| 7,304,596 B2 * | 12/2007 | Lin et al. | ....................... | 341/145 |

FOREIGN PATENT DOCUMENTS

JP 2001-044837 A 2/2001

* cited by examiner

*Primary Examiner* — Lam T Mai
(74) *Attorney, Agent, or Firm* — Sughrue Mion, PLLC

(57) ABSTRACT

A resistor string digital-to-analog converter includes a high-order resistor string, first high-order switches, a high-order decoder, a low-order decoder, and a conversion unit. The high-order resistor string includes a plurality of voltage acquisition points that are coupled through unit resistors. The high-order decoder generates a first high-order control signal in accordance with a high-order bit value, and operates in accordance with the first high-order control signal to bring into conduction a first high-order switch coupled to a pair of voltage acquisition points adjacent to each other through one or more voltage acquisition points. The low-order decoder generates a low-order control signal for controlling the conversion unit. The conversion unit divides a pair of high-order analog voltages output from a pair of voltage acquisition points.

7 Claims, 10 Drawing Sheets

RESISTOR STRING DIGITAL-TO-ANALOG CONVERTER

CROSS-REFERENCE TO RELATED APPLICATIONS

The disclosure of Japanese Patent Application No. 2009-283840 filed on Dec. 15, 2009 including the specification, drawings, and abstract is incorporated herein by reference in its entirety.

BACKGROUND OF THE INVENTION

1. Field of the Invention

The present invention relates to a digital-to-analog converter, and more particularly to a resistor string digital-to-analog converter.

2. Description of Related Art

In recent years, it is demanded that digital-to-analog converters not only have a resolution higher than 10 bits but also achieve high accuracy and low cost.

Among others, high order/low order dividing resistor string digital-to-analog converters and interpolating amplifier resistor string digital-to-analog converters achieve high resolution and area reduction.

FIG. 10 shows an example configuration of a resistor string digital-to-analog converter that is related to the present invention. The resistor string digital-to-analog converter 5 shown in FIG. 10 includes a high-order resistor string 10, which includes a plurality of unit resistors 101 and a plurality of voltage acquisition points 102, first high-order switches 51x, 51y, a high-order decoder 52, a low-order decoder 53, a digital-to-analog converter for two lowest-order bits 15, second high-order switches 54x, 54y, 55x, 55y, and a buffer 18.

By way of example, it is assumed that the resistor string digital-to-analog converter 5 shown in FIG. 10 handles a 10-bit digital input signal 20, which has eight high-order bits and two low-order bits. The resistor string digital-to-analog converter 5 will now be described with reference to FIG. 10. First of all, the eight high-order bit data of the digital input signal 20 is input into the high-order decoder 52, whereas the two low-order bit data is input into the low-order decoder 53. When a value of the digital input signal 20 ranges from 4n to 4n+3, the high-order decoder 52 outputs a first high-order control signal 521, which turns on the first high-order switches 51x, 51y coupled to the nth and (n+1)th voltage acquisition points 102, for the purpose of outputting a pair of analog voltages from the nth and (n+1)th voltage acquisition points 102 from the low-order end of the high-order resistor string 10.

Next, the high-order decoder 52 outputs a second high-order control signal 522 for the purpose of controlling the second high-order switches 54x, 54y, 55x, 55y in accordance with the digital input signal 20. In accordance with the value of the digital input signal 20, the high-order decoder 52 recognizes the magnitude relationship between voltages applied to the high-order switches 51x, 51y. Next, the higher one of the pair of analog voltages is applied to the high-order end of a low-order resistor string 150, whereas the lower analog voltage is applied to the low-order end. A low-potential signal line VL and a high-potential signal line VH each have the buffer 18 in order to decrease the impedance.

The digital-to-analog converter for two lowest-order bits 15 generates four analog voltages, which are obtained by dividing an analog voltage present between the high-potential signal line VH and low-potential signal line VL. In accordance with the result of decoding of low-order 2-bit data, the low-order decoder 53 then turns on one of a plurality of low-order switches 151. Consequently, one of the four divided analog voltages is output as an analog output signal 30 corresponding to the digital input signal 20.

Meanwhile, a two-stage digital-to-analog converter disclosed in Japanese Unexamined Patent Publication No. 2001-44837 has a high-order conversion circuit and a low-order conversion circuit, which both include a plurality of series-coupled unit resistors and a plurality of switching elements coupled to coupling points of the unit resistors.

SUMMARY

However, two output voltages obtained from the high-order resistor string 10 shown in FIG. 10 and the high-order conversion circuit described in Japanese Unexamined Patent Publication No. 2001-44837 are output from both ends of a unit resistor that forms the high-order resistor string 10 and the high-order conversion circuit and corresponds to high-order bit group data. Under ideal conditions, all the series-coupled unit resistors are equal in the potential difference thereacross. However, if a digital-to-analog converter includes unit resistors that exhibit unusual resistance values in a situation where they are, for example, bent because of the layout of the high-order resistor string 10 or high-order conversion circuit, the resistance value relatively varies from one unit resistor to another. Thus, the unit resistors differ in the output voltage potential difference thereacross. This increases the differential linearity error in a bend and the like.

According to one aspect of the present invention, there is provided a resistor string digital-to-analog converter including a high-order resistor string, first high-order switches, a high-order decoder, a low-order decoder, and a conversion unit. The high-order resistor string generates a plurality of high-order analog voltages, which are obtained by dividing a first reference voltage and a second reference voltage with unit resistors, and outputs the high-order analog voltages from a plurality of voltage acquisition points coupled through one or more of the unit resistors. The first high-order switches are provided for the voltage acquisition points on a one-to-one basis, with the conduction state thereof being controlled in accordance with a first high-order control signal. The high-order decoder generates the first high-order control signal in accordance with a high-order bit value of a digital input signal, which indicates one value with a plurality of bits, and brings a pair of the first high-order switches into conduction in accordance with the first high-order control signal. The low-order decoder generates a low-order control signal that corresponds to a value containing at least the lowest-order bit of the digital input signal. The conversion unit outputs a voltage between a pair of analog voltage values, which are obtained through the pair of the first high-order switches, in accordance with the low-order control signal. The high-order decoder brings into conduction a pair of the first high-order switches corresponding to a high-order analog voltage output from the voltage acquisition points adjacent to each other through one or more of the voltage acquisition points. When the above configuration is employed, a plurality of voltage acquisition points are included between a pair of voltage acquisition points of the high-order resistor string. As a result, a unit resistor having an error is often included between a pair of voltage acquisition points. This makes it possible to reduce conversion error.

The present invention provides a resistor string digital-to-analog converter that reduces the conversion error attributable to the relative accuracy of a unit resistor included in a resistor string.

BRIEF DESCRIPTION OF THE DRAWINGS

Exemplary embodiments of the present invention will be described in detail based on the following figures, wherein.

DETAILED DESCRIPTION OF EXEMPLARY EMBODIMENTS

Exemplary Embodiments of the present invention will now be described with reference to the accompanying drawings.

First Exemplary Embodiment

Figure 1:
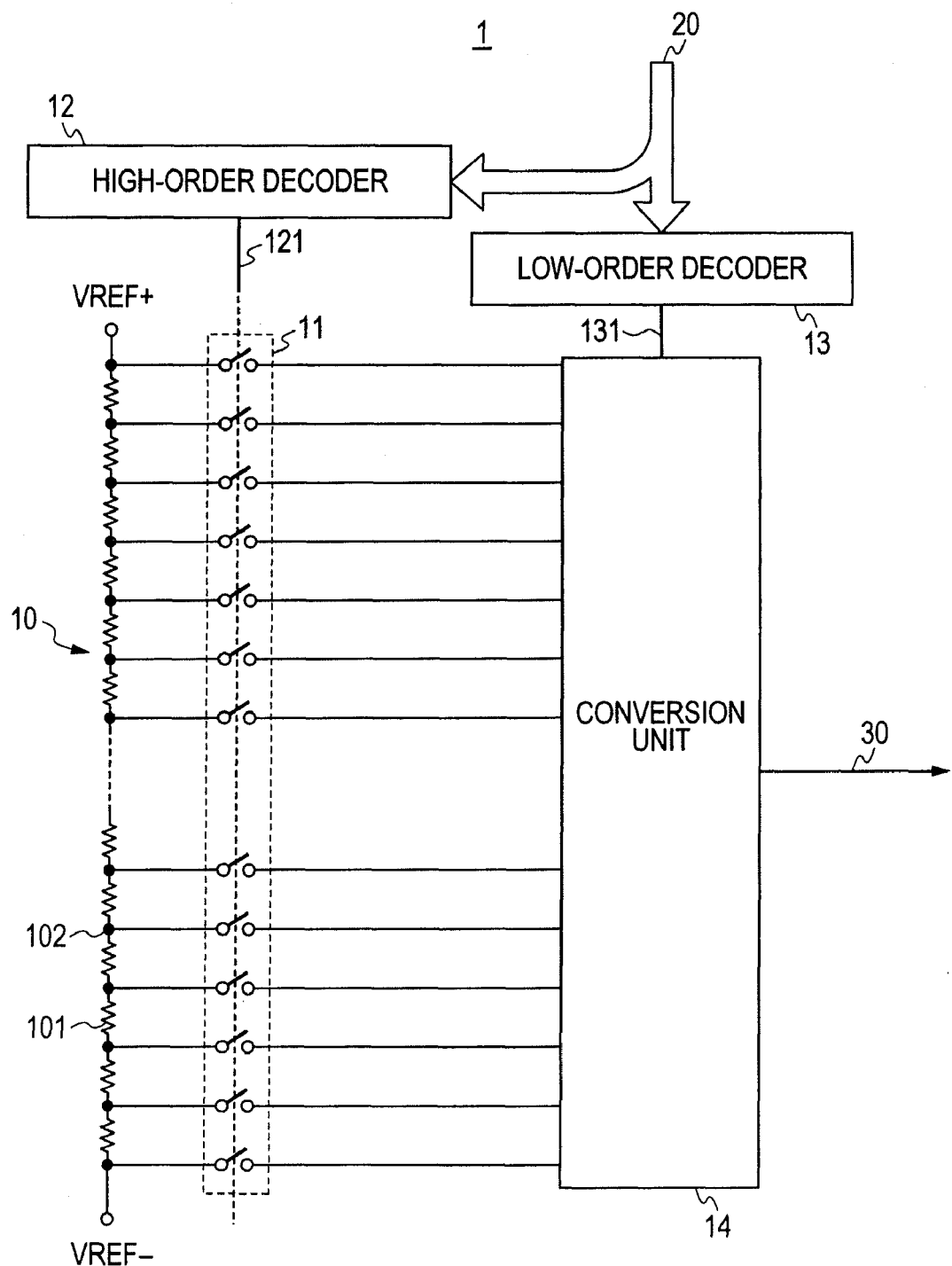
FIG. 1 is a diagram illustrating an example configuration of a resistor string digital-to-analog converter according to a first exemplary embodiment.

FIG. 1 shows a resistor string digital-to-analog converter according to a first exemplary embodiment. The resistor string digital-to-analog converter 1 includes a high-order resistor string 10, first high-order switches 11, a high-order decoder 12, a low-order decoder 13, and a conversion unit 14.

The high-order resistor string 10 includes a plurality of voltage acquisition points 102, which are coupled through unit resistors 101. The high-order resistor string 10 is divided by the unit resistors 101, which are series-coupled between a first reference voltage (e.g., high-potential reference voltage VREF+) and a second reference voltage (e.g., low-potential reference voltage VREF−). Thus, a plurality of high-order analog voltages are generated and output from the voltage acquisition points 102. Although the configuration shown in FIG. 1 is such that one unit resistor 101 is provided between the voltage acquisition points 102, the number of unit resistors 101 between the voltage acquisition points 102 is not limited to one.

One first high-order switch 11 is provided for each of the voltage acquisition points, which are included in the high-order resistor string 10. The conduction states of the first high-order switches 11 are controlled by a first high-order control signal 121, which is output from the high-order decoder 12. One terminal of each first high-order switch 11 is coupled to the associated voltage acquisition point 102, whereas the other terminal is coupled to the conversion unit 14.

The high-order decoder 12 generates the first high-order control signal 121 in accordance with the value of an arbitrarily selected high-order bit of a digital input signal 20. Further, the high-order decoder 12 brings a pair of first high-order switches 11 into conduction in accordance with the first high-order control signal 121. The present exemplary embodiment assumes that the digital input signal 20 is 10-bit data, which uses a plurality of bits to indicate a particular value. Nine high-order bits enter the high-order decoder 12, whereas the remaining one low-order bit enters the low-order decoder 13.

In the above instance, the high-order decoder 12 functions so that first high-order switches 11 coupled to the voltage acquisition points 102 adjacent to each other through one or more of the voltage acquisition points 102 are brought into conduction as the pair of first high-order switches 11. In other words, in FIG. 1, the first high-order switches 11 coupled to the voltage acquisition points 102 coupled through two or more unit resistors 101 are brought into conduction. As a result, a pair of analog voltage values obtained through the selected pair of first high-order switches 11 are given to the succeeding conversion unit 14.

The low-order decoder 13 decodes the value of a low-order bit of the digital input signal 20 and generates a low-order control signal 131 corresponding to the decoded value. The low-order bit value is low-order bit data that is formed by low-order bits, including at least the lowest-order bit, of the digital input signal 20, and may include some high-order bits. The low-order decoder 13 outputs the generated low-order control signal 131 to the conversion unit 14.

The conversion unit receives a pair of analog voltages from the high-order resistor string 10, converts a voltage between the pair of analog voltages to one voltage in accordance with the low-order control signal 131, and outputs the resulting voltage as one analog output signal 30 corresponding to the digital input signal 20.

As described above, the present exemplary embodiment is configured so that a pair of voltage acquisition points 102, between which a plurality of voltage acquisition points 102 are sandwiched, generate a pair of high-order analog voltages. Therefore, the conversion unit 14 can divide the pair of high-order analog voltages, which are developed through one or more voltage acquisition points 102. As a result, even when a pair of high-order analog voltages are output from a different pair of voltage acquisition points 102, an analog output signal 30 having the same value can be output depending on the voltage dividing method employed by the conversion unit 14.

Further, when an error occurs in a voltage between voltage acquisition points sandwiched by a pair of voltage acquisition points 102, the error is also voltage-divided in the same manner to output an analog output signal. Therefore, when an error occurs in the resistance value of a unit resistor 101 due, for instance, to a bend of the high-order resistor string 10, the influence of the error can be reduced.

Figure 10:
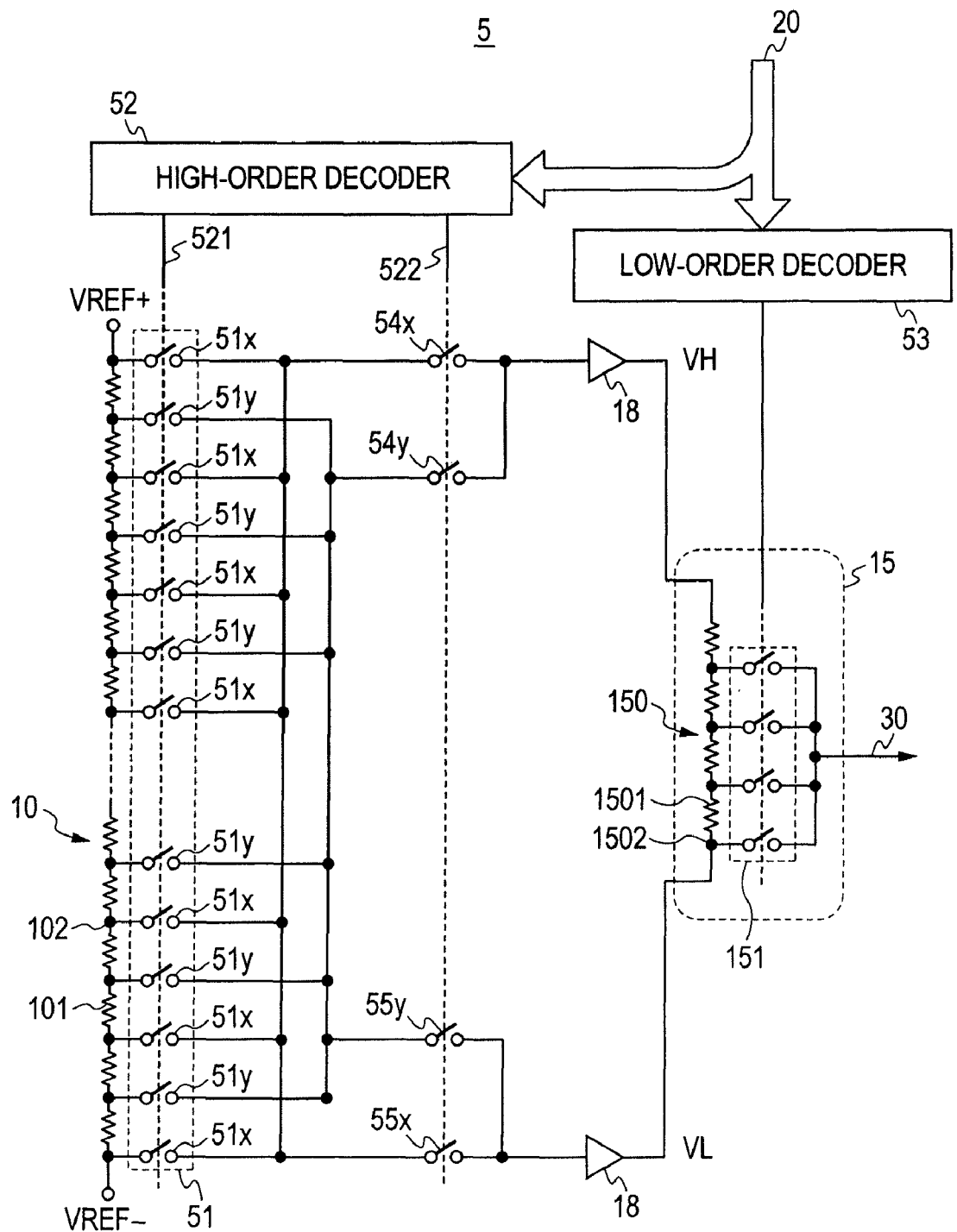
FIG. 10 is a diagram illustrating an example configuration of a related resistor string digital-to-analog converter.

Meanwhile, in the resistor string digital-to-analog converter 5 shown in FIG. 10, too, when a pair of high-order analog voltages are acquired from voltage acquisition points on both ends of a unit resistor in error, the influence of the error can be reduced as mentioned above. However, when the voltage acquisition points on both ends of the unit resistor in error are not selected, the influence of the error cannot be reduced because the error cannot be voltage-divided. In the present invention, if a unit resistor in error does not exist between a pair of voltage acquisition points 102 selected in accordance with the high-order bits but exists near the pair of voltage acquisition points 102, the high-order decoder 12 can select a pair of voltage acquisition points in such a manner as to include the unit resistor in error. As a result, the influence of the error in the unit resistor can be reduced. Obviously, even when a different pair of voltage acquisition points are selected, a desired analog output signal 30 can be obtained in accordance with the digital input signal as far as the conversion unit 14 uses an appropriate voltage dividing method, as described above.

Second Exemplary Embodiment

A second exemplary embodiment of the present invention will now be described. A digital-to-analog converter 2 according to the second exemplary embodiment includes a high-order resistor string 10, first high-order switches 11x, 11y, a high-order decoder 12, a low-order decoder 13, a low-order resistor string digital-to-analog converter 15, second high-order switches 16x 16y, 17x, 17y, and a buffer 18. By way of example, it is assumed that the resistor string digital-to-analog converter shown in FIG. 2 handles a 10-bit digital input signal 20, which has nine high-order bits and one low-order bit.

The high-order resistor string 10 has the same configuration as shown in FIG. 1. A plurality of unit resistors are series-coupled to divide a portion between the reference voltages VREF+, VREF− so that a pair of high-order analog voltages are generated and output from voltage acquisition points 102. In the present exemplary embodiment, the nine high-order bits enter the high-order decoder 12. Therefore, the high-order decoder 12 generates voltages by dividing the portion between the reference voltages VREF+, VREF− by 1024.

Figure 2:
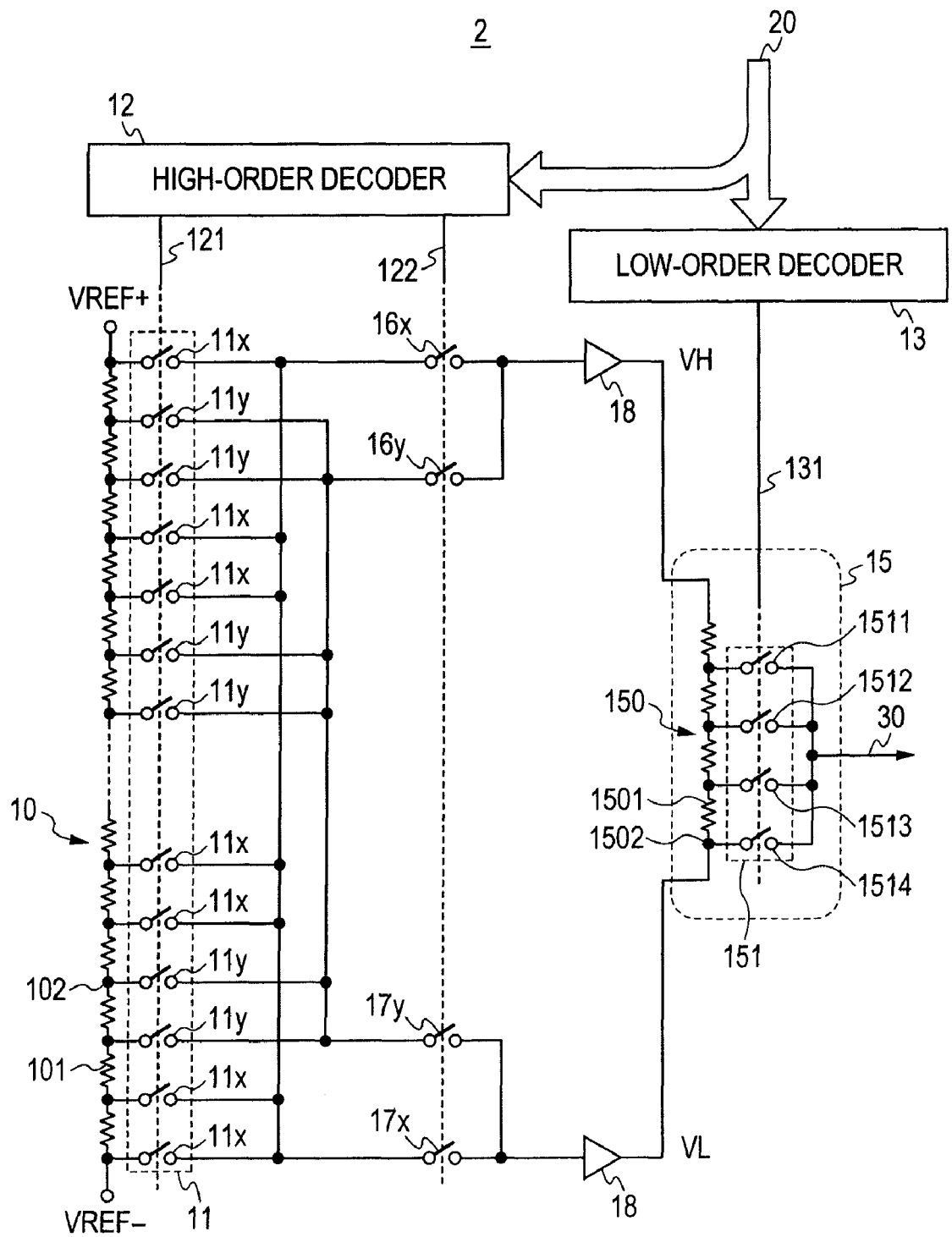
FIG. 2 is a diagram illustrating an example configuration of a resistor string digital-to-analog converter according to a second exemplary embodiment.

The coupling relationship between the first high-order switches 11 and the second high-order switches 16, 17 will now be described. Referring to FIG. 2, the first high-order switches 11x, which are coupled to voltage acquisition points 102 corresponding to a case where the high-order 8-bit data value of the digital input signal 20 is 4n or 4n+1 (n is an integer not smaller than zero), are coupled to the second high-order switches 16x, 17x. On the other hand, the first high-order switches 11y, which are coupled to voltage acquisition points 102 corresponding to a case where the high-order 8-bit data value is 4n+2 or 4n+3, are coupled to the second high-order switches 16y, 17y. A pair of analog voltages output from the high-order resistor string 10 are forwarded to a low-potential signal line VL and a high-potential signal line VH through the second high-order switches 16x, 16y, 17x, 17y.

The low-order resistor string digital-to-analog converter 15 includes a low-order resistor string 150 and low-order switches 151 (1511-1514). The low-order resistor string 150 includes a plurality of low-order resistors 1501 and a plurality of low-order voltage acquisition points 1502. The high-order end is coupled to the high-potential signal line VH, whereas the low-order end is coupled to the low-potential signal line VL. A pair of analog voltages output from the high-order resistor string 10 are forwarded to the low-potential signal line VL and high-potential signal line VH through the second high-order switches 16x 16y, 17x, 17y.

An example operation of the resistor string digital-to-analog converter 2 shown in FIG. 2 will now be described. High-order 9-bit data of the digital input signal 20 enters the high-order decoder 12, whereas low-order 1-bit data enters the low-order decoder 13.

An operation of the high-order decoder 12 will be described below with reference to a flowchart of FIG. 3. For explanation purposes, it is assumed that the value of the high-order 9-bit data forwarded to the high-order decoder 12 is n. First of all, step S101 is performed to judge whether the value of the digital input signal 20 is an odd number or an even number. If the value of the digital input signal 20 is an even number, the high-order decoder 12 proceeds to step S104 and causes the (n−1)th and (n+1)th voltage acquisition points 102 from the low-order end of the high-order resistor string 10 to output a pair of analog voltages. To do this, the high-order decoder 12 outputs a first high-order control signal 121 that turns on the first high-order switches 11x, 11y coupled to the (n−1)th and (n+1)th voltage acquisition points 102.

If, on the other hand, the value of the digital input signal 20 is an odd number, the high-order decoder 12 proceeds to step S102 and judges whether the nth unit resistor from the low-order end of the high-order resistor string 10 is likely to cause a significant error due, for instance, to a bend. In the above instance, it is assumed that the position of a unit resistor 101 in error is preset in the high-order decoder 12.

If the nth unit resistor 101 is in error, the high-order decoder 12 proceeds to step S104 and causes the (n−1)th and (n+1)th voltage acquisition points 102 from the low-order end of the high-order resistor string 10 to output a pair of analog voltages. To do this, the high-order decoder 12 outputs a first high-order control signal 121 that turns on the first high-order switches 11x, 11y coupled to the (n−1)th and (n+1)th voltage acquisition points 102.

If, on the other hand, the nth unit resistor 101 is not in error, the high-order decoder 12 proceeds to step S103 and causes the nth and (n+2)th voltage acquisition points 102 from the low-order end of the high-order resistor string 10 to output a pair of analog voltages. To do this, the high-order decoder 12 outputs a first high-order control signal 121 that turns on the first high-order switches 11x, 11y coupled to the nth and (n+2)th voltage acquisition points 102.

Figure 4:
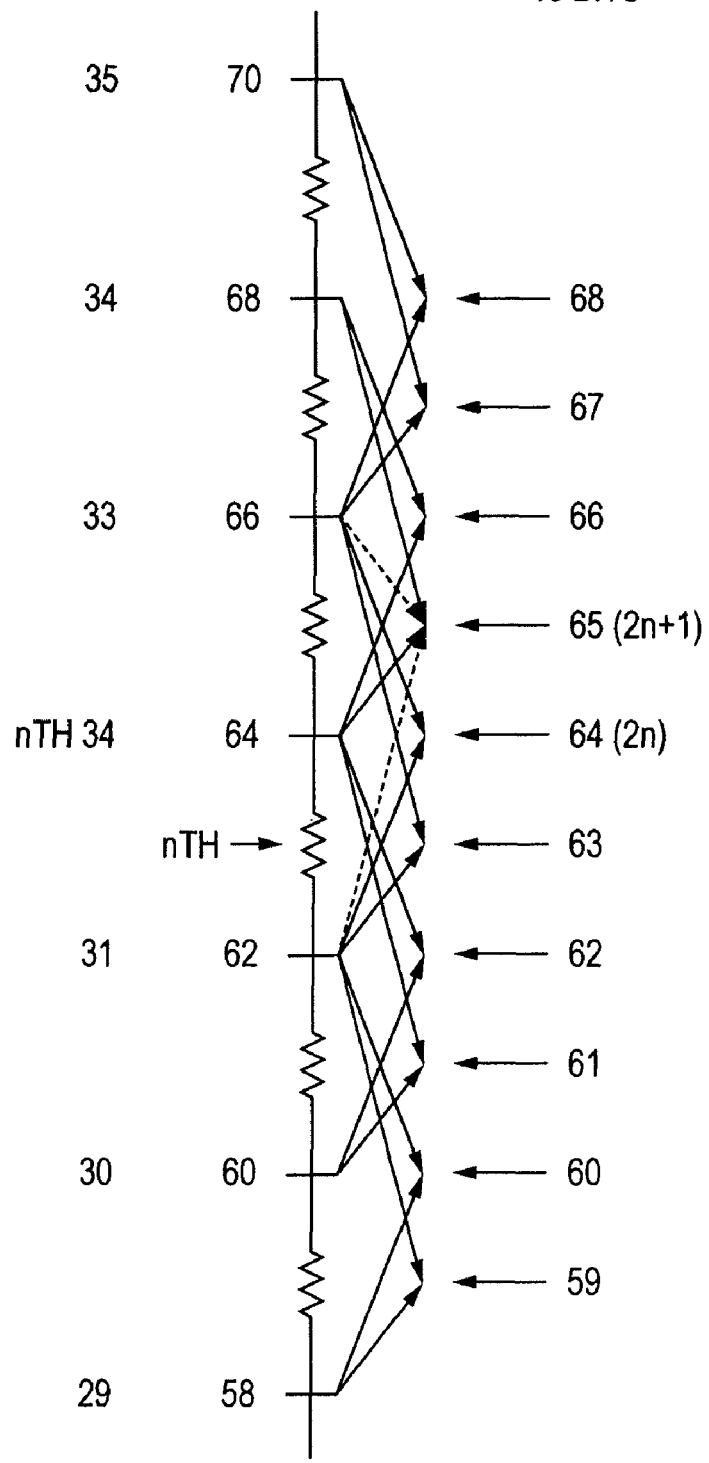
FIG. 4 is a diagram illustrating an example operation of the high-order decoder according to the second exemplary embodiment.

An operation of the high-order decoder 12 will now be described with reference to a concrete example. FIG. 4 shows a part of the high-order resistor string 10. The lower side of FIG. 4 represents the low-order side of the high-order resistor string 10, whereas the upper side represents the high-order side.

First of all, a case where no unit resistor 101 causes an error will be described. When the value of the digital input signal 20 is an odd number, the low-order resistor string digital-to-analog converter 15 subjects a pair of analog voltages to ¼ interpolation. More specifically, the low-order resistor string digital-to-analog converter 15 obtains a desired analog voltage by multiplying the low-order voltage of the pair of analog voltages by three, adding the high-order voltage to the resulting product, and dividing the result of addition by four. When, on the other hand, the value of the digital input signal 20 is an even number, the low-order resistor string digital-to-analog converter 15 subjects a pair of analog voltages to ½ interpolation. More specifically, the low-order resistor string digital-to-analog converter 15 obtains a desired analog voltage by adding the low-order voltage of the pair of analog voltages to the high-order voltage and dividing the result of addition by two.

If, for instance, the value of the digital input signal 20 is 65 (2n+1), the value of the digital input signal 20 is an odd number, and the high-order 9-bit data n is 32. Further, the nth unit resistor 101 is not in error. Therefore, the 32nd (nth) and 34th ((n+2)th) voltage acquisition points are selected as indicated in FIG. 3. A pair of analog voltages having values of 64 and 68 are then subjected to ¼ interpolation as indicated by solid arrows to output the value 65 that corresponds to the value of the digital input signal 20.

If, on the other hand, the value of the digital input signal 20 is 64 (2n), the value of the digital input signal 20 is an even number. Therefore, the 31st ((n−1)th) and 33rd ((n+1)th) voltage acquisition points are selected as indicated in FIG. 3. A pair of analog voltages having values of 62 and 66 are then subjected to ½ interpolation as indicated by solid arrows to output the value 64 that corresponds to the value of the digital input signal 20.

A case where the nth unit resistor 101 from the low-order end of the high-order resistor string 10 has an error will now be described. When the value of the digital input signal 20 is 65 as mentioned earlier and a pair of analog voltages are acquired from the 32nd and 34th voltage acquisition points from the low-order end of the high-order resistor string 10, the error cannot be voltage-divided because the unit resistor 101 having the error is not included between the pair of voltage acquisition points 102.

When the value of the digital input signal 20 is 64, a pair of analog voltages are acquired from the 32nd and 34th voltage acquisition points from the low-order end of the high-order resistor string 10 as described earlier. When the value of the digital input signal 20 is 65, a pair of analog voltages are acquired from the 31st and 33rd voltage acquisition points from the low-order end of the high-order resistor string 10 as described earlier. In these instances, the error can be voltage-divided because the unit resistor 101 having the error is included between the pair of voltage acquisition points 102.

In other words, when the value of the digital input signal 20 changes from 64 to 65, the value of the digital input signal 20 changes by 1. However, the change in an actually generated analog output signal 30 is not 1 due to the error in a unit resistor 101. This increases the differential linearity error between a case where the value of the digital input signal 20 is 64 and a case where the value is 65. Meanwhile, when the value of the digital input signal 20 is 63, a pair of analog voltages are acquired from the 31st and 33rd voltage acquisition points. It means that a unit resistor 101 having an error is included. Therefore, there is no differential linearity error between a case where the value of the digital input signal is 64 (2n) and a case where the value is 63 (2n−1). Similarly, there is no differential linearity error between a case where the value of the digital input signal is 66 (2n+2) and a case where the value is 65 (2n+1) because the unit resistors 101 included in these cases do not have an error.

Consequently, as explained with reference to FIG. 3, if the nth unit resistor 101 from the low-order end is in error, the differential linearity error may occur only when the value of the digital input signal 20 is an odd number (2n+1). Therefore, when the value of the digital input signal 20 is an odd number and the nth unit resistor 101 from the low-order end has an error, a pair of analog voltages are not acquired from the 32nd and 34th voltage acquisition points 102, but are acquired from the 31st and 33rd voltage acquisition points 102 as indicated by broken lines in FIG. 4. Subsequently, the low-order decoder 13 subjects the pair of analog voltages having values of 62 and 66 to ¾ interpolation to output a desired analog signal (the value of this analog signal is 65 in FIG. 4).

Figure 5:
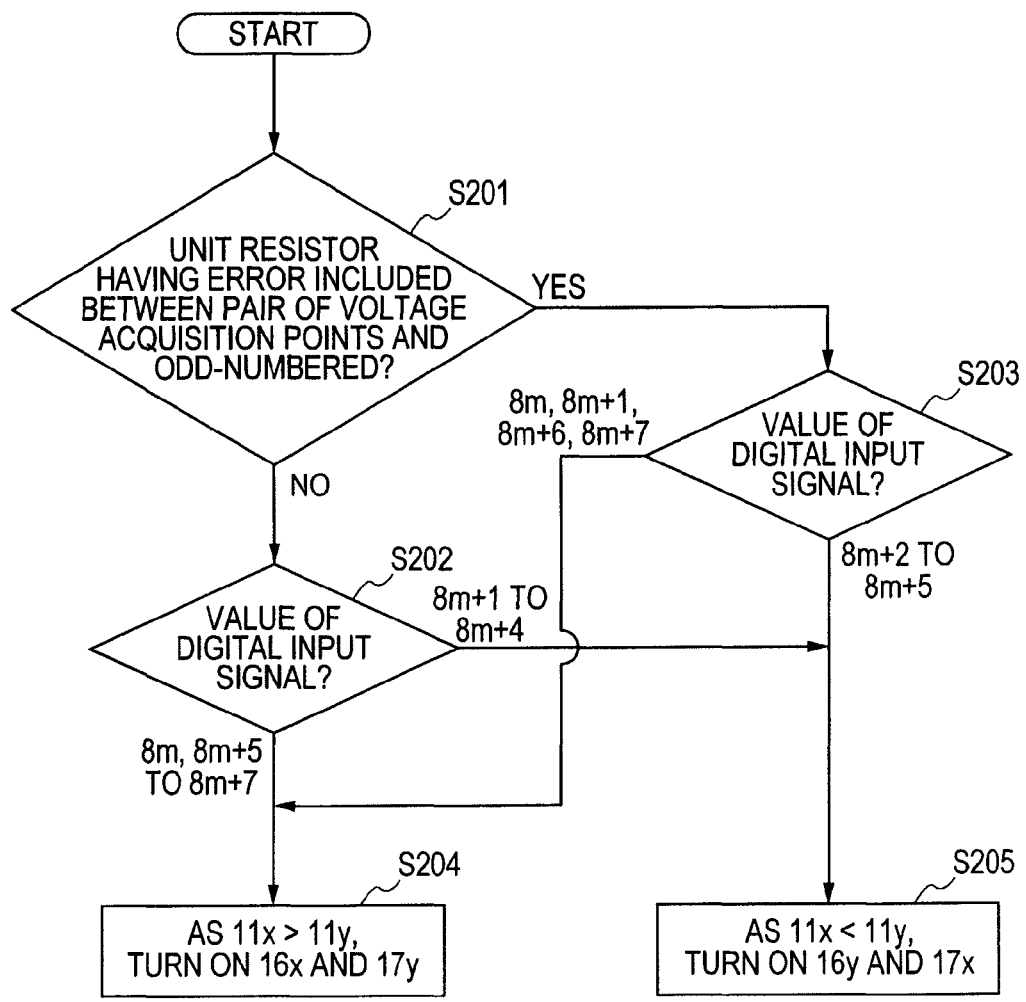
FIG. 5 is a flowchart illustrating an example operation of the high-order decoder according to the second exemplary embodiment.

Control of the second high-order switches 16, 17 will now be described with reference to FIG. 5. The high-order decoder 12 outputs a second high-order control signal 122 in order to control the second high-order switches 16x 16y, 17x, 17y in accordance with the digital input signal 20. It is assumed for explanation purposes that the value of the digital input signal 20 is between 8m and 8m+7 (m is an integer not smaller than zero).

First of all, step S201 is performed to judge whether a unit resistor 101 having an error is included between a pair of voltage acquisition points 102 selected by the high-order decoder 12 and whether the unit resistor 101 having an error is an odd-numbered unit resistor or the nth unit resistor (where n is an odd number). If no unit resistor 101 having an error is included between the pair of voltage acquisition points 102 and the value of the digital input signal 20 is 8m or between 8 m+5 and 8 m+7 (step S202), the voltage applied to the first high-order switch 11y turned on is lower than the voltage applied to the first high-order switch 11x turned on. In this instance, therefore, the first high-order switch 11y turned on is coupled to the low-potential signal line VL, and the first high-order switch 11x turned on is coupled to the high-potential signal line VH. Consequently, the high-order decoder 12 outputs the second high-order control signal 122 to turn on the second high-order switches 16x, 17y (step S204).

If no unit resistor 101 having an error is included between the pair of voltage acquisition points 102 and the value of the digital input signal 20 is between 8 m+1 and 8m+4 (step S202), the voltage applied to the first high-order switch 11y turned on is higher than the voltage applied to the first high-order switch 11x turned on. In this instance, therefore, the first high-order switch 11x turned on is coupled to the low-potential signal line VL, and the first high-order switch 11y turned on is coupled to the high-potential signal line VH. Consequently, the high-order decoder 12 outputs the second high-order control signal 122 to turn on the second high-order switches 17x, 16y (step S205).

Figure 3:
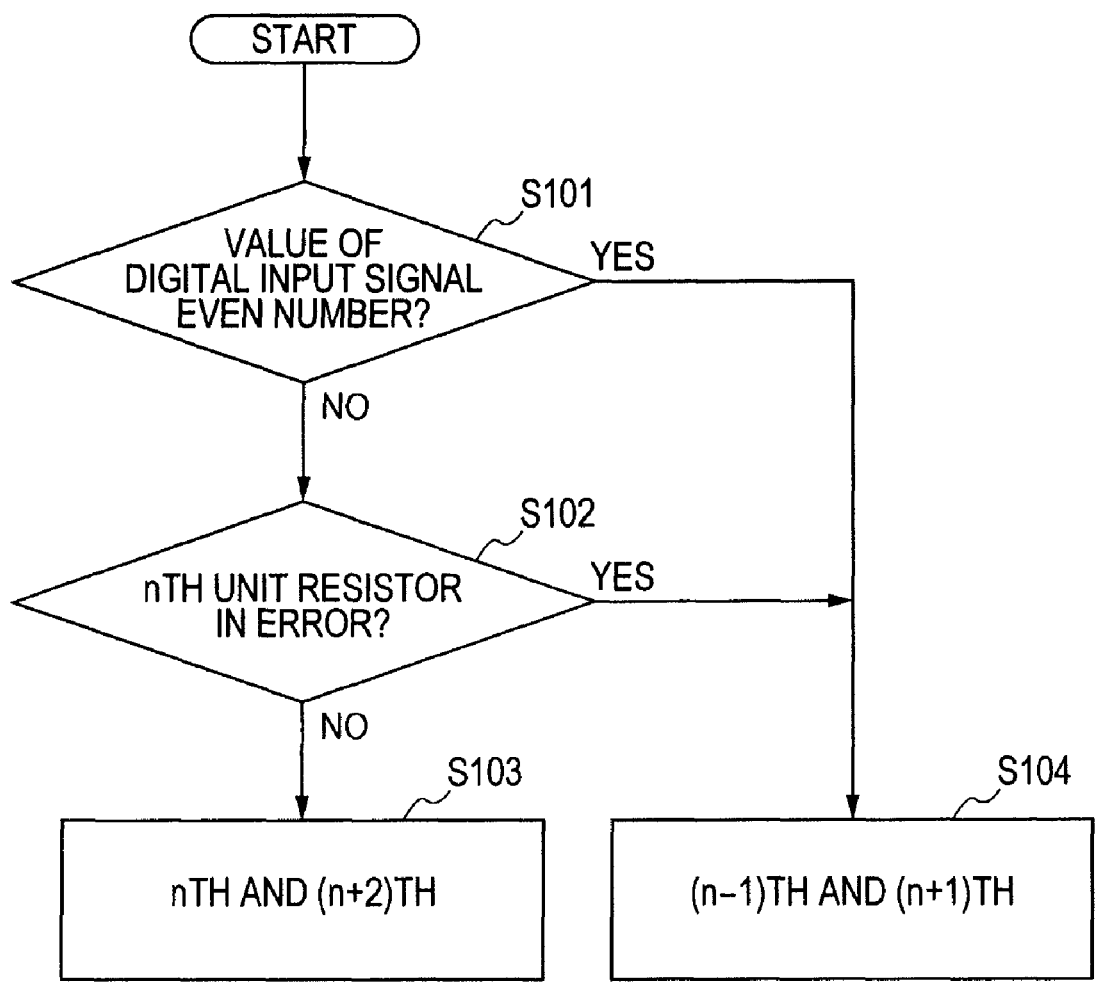
FIG. 3 is a flowchart illustrating an example operation of a high-order decoder according to the second exemplary embodiment.

If, on the other hand, a unit resistor 101 having an error is included between the pair of voltage acquisition points 102 and is an odd-numbered unit resistor or the nth unit resistor (where n is an odd number), the selection of the high-order switches 11 varies only when the value of the digital input signal 20 is an odd number, as indicated in FIG. 3. If, in this instance, a unit resistor 101 having an error is included between the pair of voltage acquisition points 102 and the value of the digital input signal 20 is 8m, 8 m+1, 8m+6, or 8 m+7 (step 203), the voltage applied to the first high-order switch 11y turned on is lower than the voltage applied to the first high-order switch 11x turned on. In this case, therefore, the first high-order switch 11y turned on is coupled to the low-potential signal line VL, and the first high-order switch 11x turned on is coupled to the high-potential signal line VH. Consequently, the high-order decoder 12 outputs the second high-order control signal 122 to turn on the second high-order switches 16x, 17y (step S204).

If a unit resistor 101 having an error is included between the pair of voltage acquisition points 102 and is an odd-numbered unit resistor or the nth unit resistor (where n is an odd number), and the value of the digital input signal 20 is between 8 m+2 and 8 m+5 (step 203), the voltage applied to the first high-order switch 11y turned on is higher than the voltage applied to the first high-order switch 11x turned on. In this instance, therefore, the first high-order switch 11x turned on is coupled to the low-potential signal line VL, and the first high-order switch 11y turned on is coupled to the high-potential signal line VH. Consequently, the high-order decoder 12 outputs the second high-order control signal 122 to turn on the second high-order switches 17x, 16y (step S205).

As described above, the second high-order switches 16, 17 are controlled to select a pair of analog voltages and forward them to the low-order resistor string digital-to-analog converter 15. When this operation is completed, the higher one of the pair of analog voltages output from the high-order resistor string 10 is forwarded to the highest-order position of the low-order resistor string 150, and the lower one is forwarded to the lowest-order position. In the present exemplary embodiment, the low-potential signal line VL and high-potential signal line VH both include a buffer 18 in order to reduce impedance.

Figure 6:
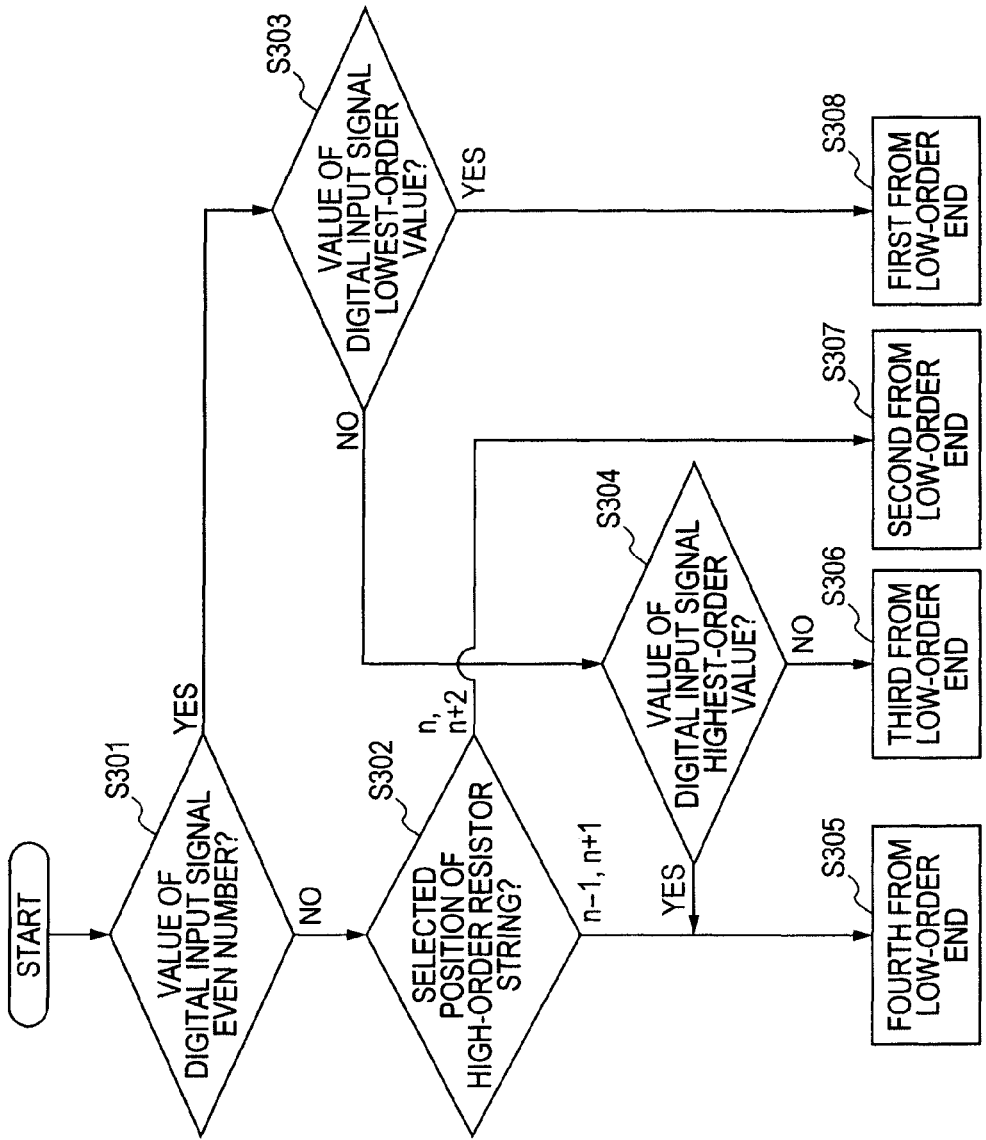
FIG. 6 is a flowchart illustrating an example operation of a low-order decoder according to the second exemplary embodiment.

The low-order resistor string digital-to-analog converter 15 corresponds to the conversion unit 14 shown in FIG. 1 and is capable of generating four analog voltages by dividing an analog voltage between the high-potential signal line VH and low-potential signal line VL. An example operation of the low-order resistor string digital-to-analog converter 15 will now be described with reference to a flowchart of FIG. 6. First of all, step S301 is performed to judge whether the value of the digital input signal 20 is an odd number or an even number.

If the value of the digital input signal 20 is an odd number, step S302 is performed to determine the positions of a pair of voltage acquisition points 102 selected by the high-order resistor string 10. It is assumed in this instance that the value of high-order 9-bit data is n. If a pair of analog voltages are output from the nth and (n+2)th voltage acquisition points 102 from the low-order end of the high-order resistor string 10, the low-order decoder 13 turns on a low-order switch 1513, which is one of a plurality of low-order switches 151, so as to acquire a voltage from the second low-order voltage acquisition point 1502 from the low-order end of the low-order resistor string 150 (step S307).

If a pair of analog voltages are output from the (n−1)th and (n+1)th voltage acquisition points 102 from the low-order end of the high-order resistor string 10, step S305 is performed to turn on a low-order switch 1511, which is one of the low-order switches 151, so as to acquire a voltage from the fourth low-order voltage acquisition point 1502 from the low-order end of the low-order resistor string 150.

If, on the other hand, the value of the digital input signal 20 is an even number, step S303 is performed to judge whether the value of the digital input signal 20 is a lowest-order value. If the value of the digital input signal 20 is a lowest-order value, the low-order decoder 13 turns on a low-order switch 1514, which is one of the low-order switches 151, so as to acquire a voltage from the first low-order voltage acquisition point 1502 from the low-order end of the low-order resistor string 150 (step S308).

If the value of the digital input signal 20 is not a lowest-order value, step S304 is performed to judge whether the value of the digital input signal 20 is a highest-order value. If the value of the digital input signal 20 is a highest-order value, the low-order decoder 13 turns on the low-order switch 1511, which is one of the low-order switches 151, so as to acquire a voltage from the fourth low-order voltage acquisition point 1502 from the low-order end of the low-order resistor string 150 (step S305).

If the value of the digital input signal 20 is neither a lowest-order value nor a highest-order value, the low-order decoder 13 turns on a low-order switch 1512, which is one of the low-order switches 151, so as to acquire a voltage from the third low-order voltage acquisition point 1502 from the low-order end of the low-order resistor string 150 (step S306). When the above operation is completed, an analog output signal 30 corresponding to the digital input signal 20 is output.

In the present exemplary embodiment, voltages across two consecutive unit resistors are used as the high-potential reference voltage and low-potential reference voltage of the low-order resistor string digital-to-analog converter 15. Therefore, when the result of digital-to-analog conversion in the vicinity of the unit resistors, which are likely to have a significant error, is to be obtained, the differential linearity error caused by the relative error of the unit resistors can be reduced as indicated by the following equations.

In the resistor string digital-to-analog converter 5 shown in FIG. 10, it is assumed that the 10-bit digital input signal 20 is p, and that the analog output voltage of the whole digital-to-analog converter is V(p), and further that a high-order 8-bit input signal is r. It is also assumed that the output voltage of a high-order 8-bit resistor string digital-to-analog converter is V8(r). If, in this instance, the rth resistor from the low-order end of the high-order resistor string is in error (err), the analog output voltage near the rth resistor from the low-order end is as indicated below when expressed in LSBs, which is a unit indicating the minimum weight. The error err is an error relative to the whole resistor string and expressed in LSBs.

$$V(4r-4) = \{V8(r-1) + V8(r-1)\}/2 \quad (1)$$
$$= \{(4r-4)LSB \times 2\}/2$$
$$= (4r-4)LSB$$

$$V(4r-3) = \{V8(r-1) \times 3 + V8(r)\}/4 \quad (2)$$
$$= \{(4r-4)LSB \times 3 + (4r+err)LSB\}/4$$
$$= (4r-3+err/4)LSB$$

$$V(4r-2) = \{V8(r-1) + V8(r)\}/2 \quad (3)$$
$$= \{(4r-4)LSB + (4r+err)LSB\}/2$$
$$= (4r-2+err/2)LSB$$

$$V(4r-1) = \{V8(r-1) + V8(r) \times 3\}/4 \quad (4)$$
$$= \{(4r-4)LSB + (4r+err)LSB \times 3\}/4$$
$$= (4r-1+err \times 3/4)LSB$$

$$V(4r) = \{V8(r) + V8(r)\}/2 \quad (5)$$
$$= \{(4r+err)LSB \times 2\}/2$$
$$= (4r+err)LSB$$

In the above instance, the differential linearity error, which indicates the deviation from the ideal when the value of the digital input signal is increased by 1, is (err/4)LSB at a maximum.

Meanwhile, in the resistor string digital-to-analog converter 2 according to the present exemplary embodiment, when a high-order 9-bit input signal is q, the output voltage of a high-order 9-bit resistor string digital-to-analog converter is V9(q), and the qth resistor from the low-order end of the high-order resistor string is in error (err), the analog output voltage in the vicinity of the qth resistor is as indicated below:

$$V(2q-4) = \{V9(q-3) + V9(q-1)\}/2 \quad (6)$$
$$= \{(2q-6)LSB + (2q-2)LSB\}/2$$
$$= (2q-4)LSB$$

$$V(2q-3) = \{V9(q-2) \times 3 + V9(q)\}/4 \quad (7)$$
$$= \{(2q-4)LSB \times 3 + (2q+err)LSB\}/4$$
$$= (2q-3+err/4)LSB$$

$$V(2q-2) = \{V9(q-2) + V9(q)\}/2 \quad (8)$$
$$= \{(2q-4)LSB + (2q+err)LSB\}/2$$
$$= (2q-2+err/2)LSB$$

$$V(2q-1) = \{V9(q-1) \times 3 + V9(q+1)\}/4 \quad (9)$$
$$= \{(2q-2)LSB \times 3 + (2q+2+err)LSB\}/4$$
$$= (2q-1+err/4)LSB$$

$$V(2q) = \{V9(q-1) + V9(q+1)\}/2 \quad (10)$$
$$= \{(2q-2)LSB + (2q+2+err)LSB\}/2$$
$$= (2q+err/2)LSB$$

$$V(2q+1) = \{V9(q-1) + V9(q+1) \times 3\}/4 \quad (11)$$
$$= \{(2q-2)LSB + (2q+2+err)LSB \times 3\}/4$$
$$= (2q+1+3/4 \times err)LSB$$

$$V(2q+2) = \{V9(q) + V9(q+2)\}/2 \quad (12)$$
$$= \{(2q+err)LSB + (2q+4+err)LSB\}/2$$
$$= (2q+2+err)LSB$$

In the above instance, the differential linearity error is (err/4) LSB at a maximum. The high-order resistor string 10 for the resistor string digital-to-analog converter 5 shown in FIG. 10 is of an 8-bit type, whereas the high-order resistor string 10 according to the present exemplary embodiment is of a 9-bit type. Therefore, the area of the whole resistor string can be maintained the same by reducing the area and resistance value of a unit resistor to half as compared to the resistor string digital-to-analog converter 5. In such an instance, however, the absolute value of error in the unit resistor value of the whole digital-to-analog converter is approximately ½ as compared to a conventional example when the error is attributable to a special shape or approximately 1/√2 as compared to a conventional example when the error is attributable to relative accuracy. In other words, the present exemplary embodiment reduces the error err to ½ to 1/√2 as compared to the resistor string digital-to-analog converter 5, and also reduces the differential linearity error to ½ to 1/√2 as compared to a conventional example.

Third Exemplary Embodiment

Figure 7:
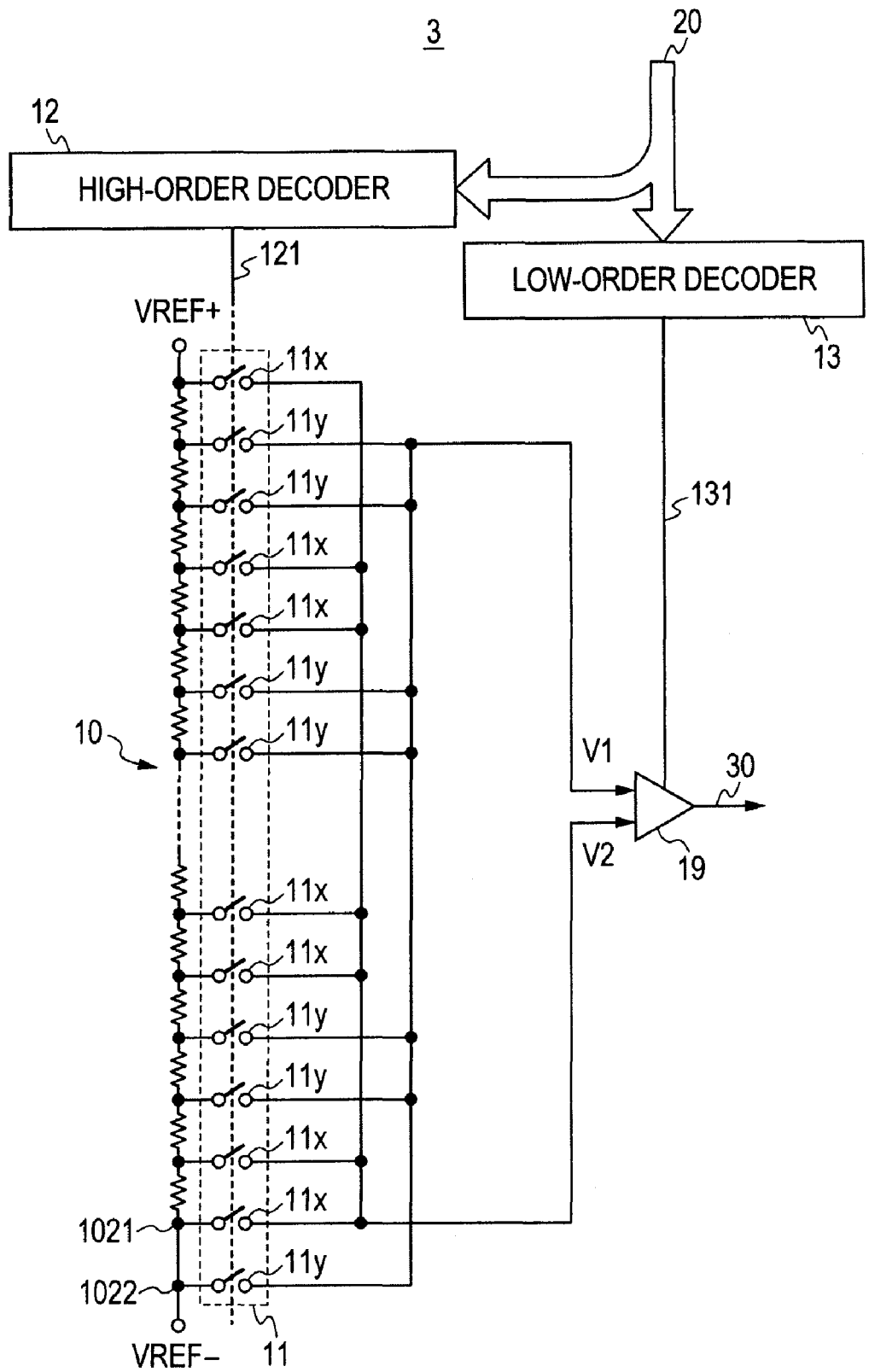
FIG. 7 is a diagram illustrating an example configuration of the resistor string digital-to-analog converter according to a third exemplary embodiment.

A third exemplary embodiment of the present invention will now be described. FIG. 7 is a diagram illustrating an example configuration of a resistor string digital-to-analog converter 3 according to the third exemplary embodiment. The resistor string digital-to-analog converter 3 shown in FIG. 7 includes a high-order resistor string 10, first high-order switches 11, a high-order decoder 12, a low-order decoder 13, and an interpolating amplifier 19. The present exemplary embodiment will be described on the assumption that the digital input signal 20 is of a 10-bit type, divided into nine high-order bits and three low-order bits, and subjected to digital-to-analog conversion. In this instance, the two lowest-order bits of the nine high-order bits are duplicates of the two highest-order bits of the three low-order bits. The third exemplary embodiment differs from the second exemplary embodiment in the configuration of the high-order resistor string 10. More specifically, the first high-order switch 11y is coupled to the low-potential reference voltage VREF−. In the other respects, the configuration is the same as that of the second exemplary embodiment and will not be redundantly described herein.

The first high-order switch 11x is coupled to one end of a signal line V2, whereas the first high-order switch 11y is coupled to one end of a signal line V1. The other ends of signal lines v1, V2 are coupled to the interpolating amplifier 19.

An example operation of the resistor string digital-to-analog converter 3 shown in FIG. 7 will now be described. Operations performed by the first high-order switches 11 and high-order decoder 12 to acquire a pair of analog voltages from the high-order resistor string 10 are the same as described in connection with the second exemplary embodiment. In other words, when the lowest-order bit of the digital input signal 20 is 0, a pair of analog voltages are output from the (n−1)th and (n+1)th voltage acquisition points 102 from the low-order end of the high-order resistor string 10. When, on the other hand, the lowest-order bit of the digital input signal 20 is 1, the high-order decoder 12 outputs a pair of analog voltages from the nth and (n+2)th voltage acquisition points 102 from the low-order end of the high-order resistor string 10. Meanwhile, when some particular values are represented by the digital input signal 20, a predefined operation is performed to output a first high-order control signal 121 that turns on the first high-order switches 11x, 11y coupled to the (n−1)th and (n+1)th voltage acquisition points 102 from the low-order end of the high-order resistor string 10. In this instance, however, the voltage acquisition point 1021 shown in FIG. 7 is assumed to be the 0th voltage acquisition point.

It should be noted in this connection that the resistor string digital-to-analog converter 3 shown in FIG. 7 does not include the second high-order switches 16x, 16y, 17x, 17y, which are shown in FIG. 2. Therefore, the analog voltage output from the first high-order switch 11x is always forwarded to the signal line V2 irrespective of the magnitude relationship to the analog voltage output from the first high-order switch 11y. Similarly, the analog voltage output from the first high-order switch 11y is always forwarded to the signal line V1. Consequently, a pair of analog voltages whose magnitude relationship is not defined are input into the interpolating amplifier 19 from the signal line V1 and signal line V2.

Figure 8:
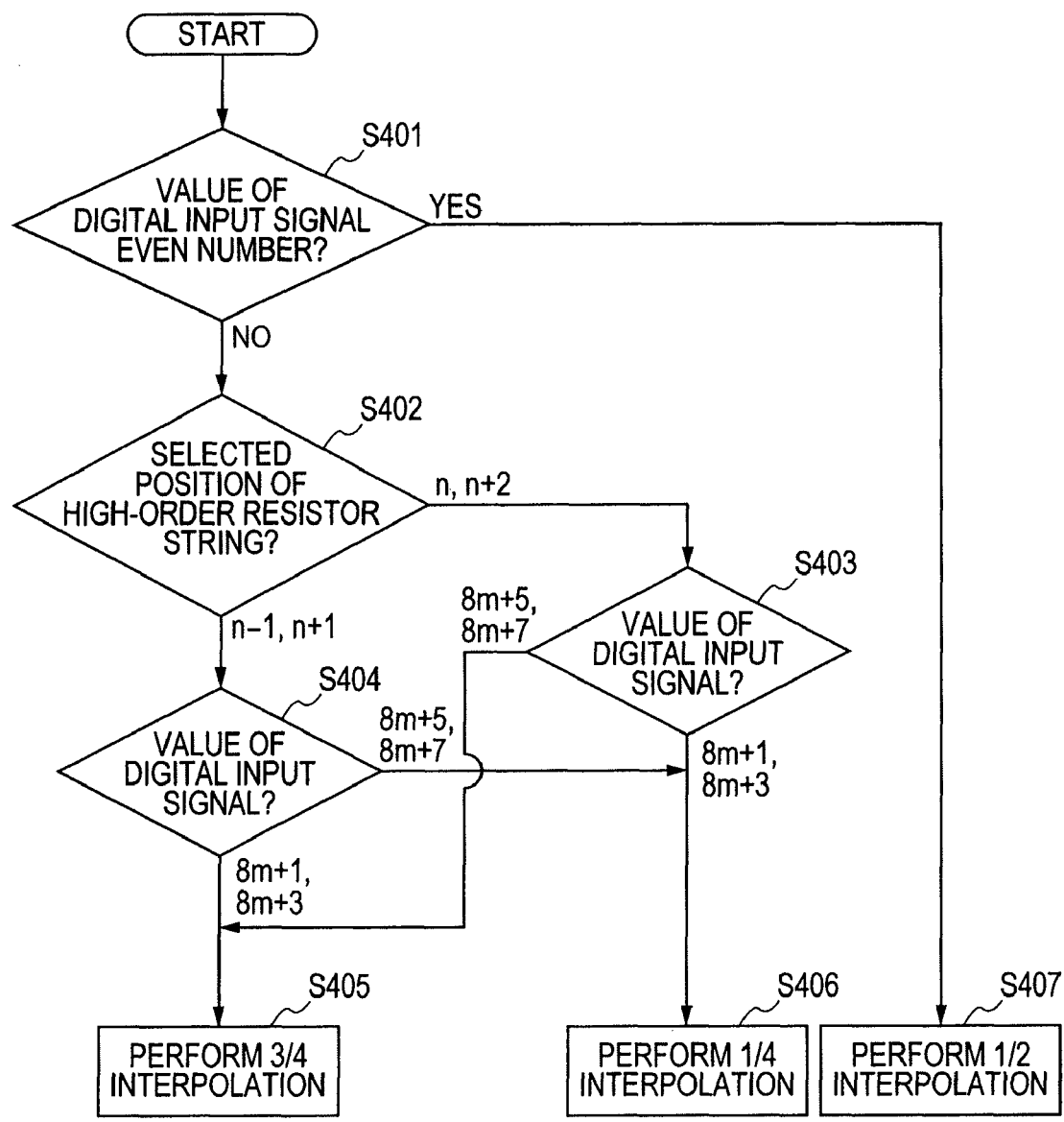
FIG. 8 is a flowchart illustrating an example operation of an interpolating amplifier according to the third exemplary embodiment.

An example operation of the interpolating amplifier 19 will now be described with reference to FIG. 8. First of all, step S401 is performed to judge whether the digital input signal 20 is an even number or an odd number. If the value of the digital input signal 20 is 8m, 8 m+2, 8 m+4, or 8 m+6, that is, an even number, the interpolating amplifier 19 disregards the voltage relationship between the signal line V1 and signal line V2, generates a voltage that is half the sum of two input voltages (½ interpolation), and outputs the generated voltage as the analog output signal 30 (step S407).

If the value of the digital input signal 20 is an odd number, a pair of analog voltages are output from the nth and (n+2)th voltage acquisition points 102 from the low-order end of the high-order resistor string 10 (step S402), and the value of the digital input signal 20 is 8 m+1 or 8 m+3 (step S403), the voltage value of the signal line V1 is greater than the voltage value of the signal line V2. In this instance, the interpolating amplifier 19 generates a voltage that is equal to (V1 voltage value+V2 voltage value×3)/4 in response to the input voltage (¼ interpolation), and outputs the generated voltage as the analog output signal 30 (step S406). If the value of the digital input signal 20 is 8 m+5 or 8 m+7 (step S403), the voltage value of the signal line V1 is smaller than the voltage value of the signal line V2. In this instance, the interpolating amplifier 19 generates a voltage that is equal to (V1 voltage value×3+ V2 voltage value)/4 in response to the input voltage (¾ interpolation), and outputs the generated voltage as the analog output signal 30 (step S405).

If a pair of analog voltages are output from the (n−1)th and (n+1)th voltage acquisition points 102 from the low-order end of the high-order resistor string 10 (step S402) and the value of the digital input signal 20 is 8 m+1 or 8 m+3 (step S404), the voltage value of the signal line V1 is greater than the voltage value of the signal line V2. However, the interpolating amplifier 19 generates a voltage that is equal to (V1 voltage value×3+V2 voltage value)/4 in response to the input voltage (¾ interpolation), and outputs the generated voltage as the analog output signal 30 (step S405). If the value of the digital input signal 20 is 8 m+5 or 8 m+7 (step S404), the voltage value of the signal line V1 is smaller than the voltage value of the signal line V2. However, the interpolating amplifier 19 generates a voltage that is equal to (V1 voltage value+V2 voltage value×3)/4 in response to the input voltage (¼ interpolation), and outputs the generated voltage as the analog output signal 30 (step S406).

As described above, the interpolating amplifier 19 divides a pair of analog voltages in accordance with a low-order control signal 131, which is output from the low-order decoder 13 in accordance with the value of the digital input signal 20, and outputs an analog output signal 30 that corresponds to the digital input signal 20. When a lowest-order code of the digital input signal 20 is to be input, the high-order decoder 12 inputs voltage acquisition points 1021, 1022 into the interpolating amplifier 19. The interpolating amplifier 19 then performs ½ interpolation and outputs the low-potential reference voltage VREF−.

As described above, when the resistor string digital-to-analog converter 3 according to the present exemplary embodiment is used, a pair of analog voltages are acquired across two consecutive unit resistors, as is the case with the second exemplary embodiment, even in a situation where the interpolating amplifier 19 is included. Therefore, the differential linearity error can be reduced. Further, when an operation is performed to output the lowest-order code, the VREF− voltage is output as both the two output voltages V1, V2 of the high-order resistor string digital-to-analog converter. Even when an operation is performed to output the highest-order code, ¾ interpolation can be performed by the low-order resistor string digital-to-analog converter or interpolating amplifier while the potential difference between the output voltages V1 and V2 is the same as in a case where a central code is selected. Consequently, highly accurate decoding results can be obtained even in the vicinity of the lowest-order code and in the vicinity of the highest-order code.

Fourth Exemplary Embodiment

A fourth exemplary embodiment of the present invention will now be described. The first to third exemplary embodiments have been described on the assumption that a unit resistor 101 is in error (e.g., a unit resistor error caused by a manufacturing process) without regard to a bend in the high-order resistor string. The fourth exemplary embodiment will be described with reference to a resistor string digital-to-analog converter in which the high-order resistor string 10 is actually bent multiple times with switches and signal lines disposed efficiently. The present exemplary embodiment will be described on the assumption that the digital input signal 20 is of a 6-bit type, divided into five high-order bits and two low-order bits, and subjected to digital-to-analog conversion. The five high-order bits are input into the high-order decoder 12, whereas the two low-order bits are input into the low-order decoder 13. The lowest-order bit of the five high-order bits is a duplicate of the highest-order bit of the two low-order bits.

Figure 9:
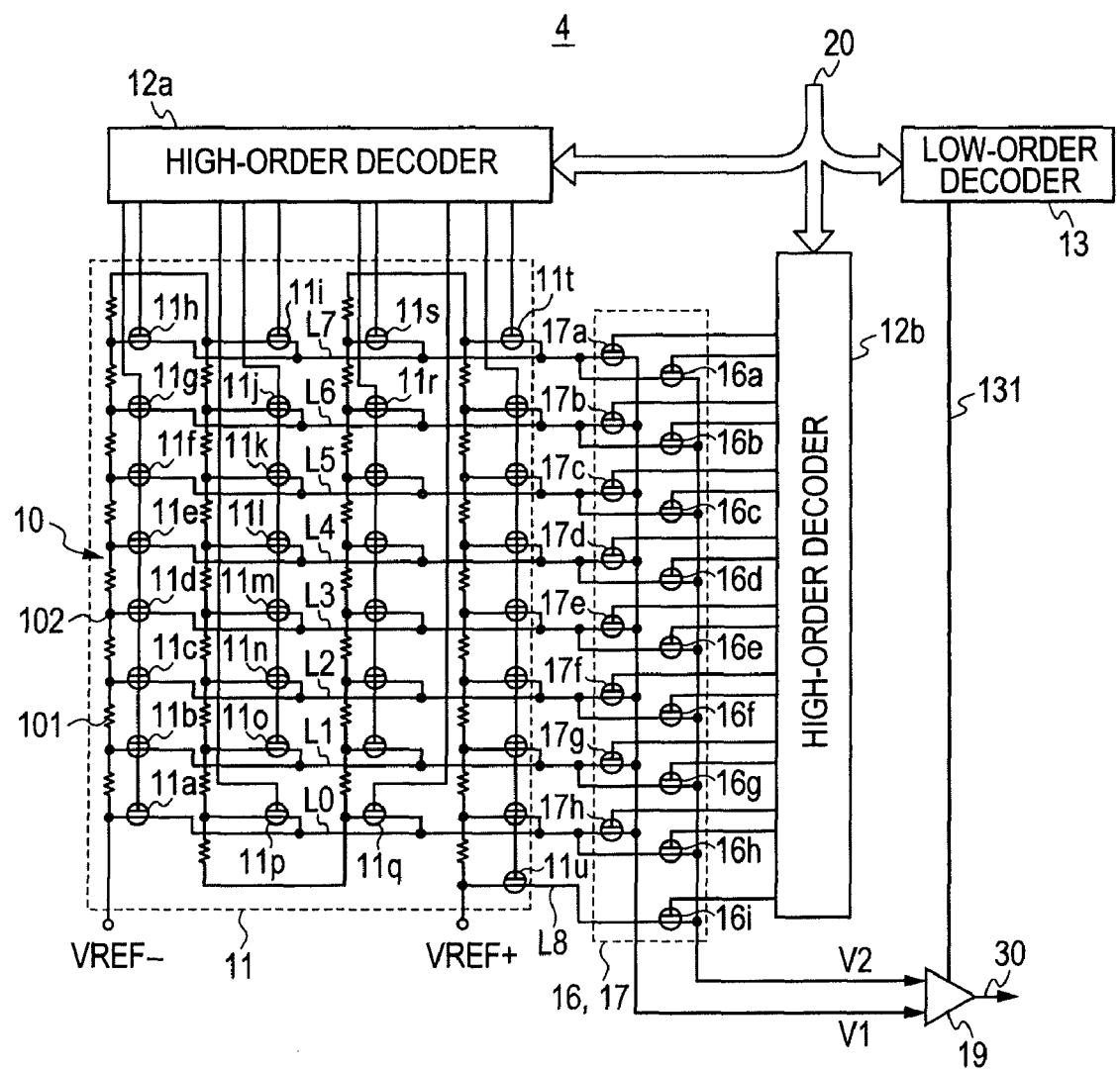
FIG. 9 is a diagram illustrating an example configuration of the resistor string digital-to-analog converter according to a fourth exemplary embodiment.

The resistor string digital-to-analog converter 4 shown in FIG. 9 includes a high-order resistor string 10, first high-order switches 11, high-order decoders 12a, 12b, a low-order decoder 13, second high-order switches 16, 17, and an interpolating amplifier 19. The high-order resistor string 10 is bent each time eight first high-order switches, beginning with a first high-order switch 11a coupled to the lowest-order voltage acquisition point, are coupled to the high-order side. In other words, the high-order resistor string 10 is bent four times between the low-potential reference voltage VREF− and high-potential reference voltage VREF+. It should be noted, however, that the number of times the high-order resistor string 10 is bent is not limited to four.

A plurality of signal lines L0-L8 are disposed in a direction perpendicular to the direction of a resistor row of the high-order resistor string 10. Each signal line is coupled to a voltage acquisition point 102 (first voltage acquisition point) and to a neighboring voltage acquisition point (second voltage acquisition point) positioned in a direction perpendicular to the direction of the resistor row of the high-order resistor string 10. However, it is assumed that the second voltage acquisition point does not include the first voltage acquisition point or a neighboring voltage acquisition point positioned in the direction of the resistor row of the high-order resistor string 10.

In the resistor string digital-to-analog converter 4 shown in FIG. 9, for example, when a voltage acquisition point 102 coupled to a first high-order switch 11f is the first voltage acquisition point, a voltage acquisition point 102 coupled to a first high-order switch 11k is the second voltage acquisition point. Further, when a voltage acquisition point 102 coupled to a first high-order switch 11j is the first voltage acquisition point, a voltage acquisition point 102 coupled to a first high-order switch 11g or a first high-order switch 11r is the second voltage acquisition point.

The second high-order switches 16, 17 are coupled at one end to the signal lines L0-L7 and at the other end to the signal lines V1, V2, which are coupled to the interpolating amplifier 19. Further, the signal line L8 is coupled to one end of the second high-order switch 16i, and the other end of the second high-order switch 16i is coupled to the signal line V2.

The high-order decoder 12a controls the first high-order switches 11 in accordance with the five high-order bit data of the digital input signal 20. However, the first high-order switches 11h, 11i, 11p, 11q, 11s, 11t near a bend are individually controlled, whereas the other first high-order switches are collectively controlled with respect to each resistor row of the bend high-order resistor string 10. For example, the first high-order switches 11a-11g shown in FIG. 9 are collectively controlled.

The high-order decoder 12b controls the second high-order switches 16, 17 in accordance with the five high-order bit data of the digital input signal 20. The high-order decoder 12b turns on one of the second high-order switches 17a-17h so that either one of a pair of analog voltages, which are forwarded through the signal lines Lo-L7 under the control of the first high-order switches 11 of the high-order decoder 12a, are forwarded to the signal line V1. Further, the high-order decoder 12b turns on one of the second high-order switches 16a-16i so that analog voltages at the other ends of the signal lines L0-L7 are forwarded to the signal line V2.

As is the case with the third exemplary embodiment, the interpolating amplifier 19 divides a pair of analog voltages in accordance with the low-order control signal 131, which is output from the low-order decoder 13 in accordance with the value of the digital input signal 20, and outputs an analog output signal 30 that corresponds to the digital input signal 20. The interpolating amplifier may be replaced by a resistor string that is similar to the one shown in FIG. 2.

An operation of the resistor string digital-to-analog converter 4 shown in FIG. 9 will now be described with reference to a concrete example. The operation described below is performed when voltages developed before and after a bend of the high-order resistor string 10 are to be selected, that is, when the value of the digital input signal 20 is between 9 and 20. The operation will be described on the assumption that VREF=(high-potential reference voltage VREF+)−(low-potential reference voltage VREF−), and that the low-potential VREF−=0 V.

At first, if the value of the digital input signal 20 is between 9 and 10, the high-order decoder 12a turns on the first high-order switches 11a-11g, and the high-order decoder 12b turns on the second high-order switches 17d, 16b. As the second high-order switch 17d is coupled to the first high-order switch 11e, a voltage value of $4/32$ VREF, which is a voltage value of the voltage acquisition point 102 of the high-order resistor string 10 that is coupled to the first high-order switch 11e, is output to the signal line V1. Similarly, a voltage value of $6/32$ VREF, which is a voltage value of the voltage acquisition point 102 of the high-order resistor string 10 that is coupled to the first high-order switch 11g, is output to the signal line V2.

If the value of the digital input signal 20 is between 11 and 12, the high-order decoder 12a turns on the first high-order switches 11a-11g, 11h, and the high-order decoder 12b turns on the second high-order switches 17c, 16a. Then, a voltage value of $5/32$ VREF is output to the signal line V1, and a voltage value of $7/32$ VREF is output to the signal line V2.

If the value of the digital input signal 20 is between 13 and 14, the high-order decoder 12a turns on the first high-order switches 11a-11g, 11i, and the high-order decoder 12b turns on the second high-order switches 17b, 16a. Then, a voltage value of $6/32$ VREF is output to the signal line V1, and a voltage value of $8/32$ VREF is output to the signal line V2.

If the value of the digital input signal 20 is between 15 and 17, the high-order decoder 12a turns on the first high-order switches 11h, 11j-11o, and the high-order decoder 12b turns on the second high-order switches 17a, 16b. Then, a voltage value of $7/32$ VREF is output to the signal line V1, and a voltage value of $9/32$ VREF is output to the signal line V2.

If the value of the digital input signal 20 is 18, the high-order decoder 12a turns on the first high-order switches 11i, 11j-11o, and the high-order decoder 12b turns on the second high-order switches 17a, 16c. Then, a voltage value of $8/32$ VREF is output to the signal line V1, and a voltage value of $10/32$ VREF is output to the signal line V2.

If the value of the digital input signal 20 is between 19 and 20, the high-order decoder 12a turns on the first high-order switches 11j-11o, and the high-order decoder 12b turns on the second high-order switches 17b, 16d. Then, a voltage value of $9/32$ VREF is output to the signal line V1, and a voltage value of $11/32$ VREF is output to the signal line V2.

The high-order decoder 12a controls the first high-order switches 11 in such a manner that no signal line L0-L8 is coupled to two or more turned-on first high-order switches 11.

As described above, all the values of the digital input signal 20 are such that the voltage value of the signal line V1 is smaller than the voltage value of the signal line V2.

The interpolating amplifier 19 determines the magnitude relationship between a pair of analog voltages input from the signal lines V1, V2 by using the highest-order bit of the low-order bits, and divides the analog voltages in accordance with the low-order control signal 131 from the low-order decoder 13. An operation of the interpolating amplifier 19 will now be described with reference to a concrete example.

If the value of the digital input signal 20 is 2n, the interpolating amplifier 19 generates a voltage that is half the sum of two input voltages ($1/2$ interpolation), outputs the generated voltage as the analog output signal 30, and obtains a desired voltage.

If the value of the digital input signal 20 is 2n+1 and the digital input signal 20 generating the V1 and V2 voltages across a bend of the high-order resistor string 10 represents a value other than 17, 33, and 49, the interpolating amplifier 19 generates a voltage that is equal to (3×V1 voltage value+V2 voltage value)/4 ($1/4$ interpolation), outputs the generated voltage as the analog output signal 30, and obtains a desired voltage.

If the value of the digital input signal 20 is 17, 33, or 49, the interpolating amplifier 19 generates a voltage that is equal to (V1 voltage value+3×V2 voltage value)/4 ($3/4$ interpolation), outputs an analog output signal 30 corresponding to the digital input signal 20, and obtains a desired voltage.

As described above, the present exemplary embodiment provides a substantially square-shaped circuit when the high-order resistor string is bent for configuration purposes. This provides increased ease of configuration and permits efficient coupling to peripheral circuits. Further, when a high-order digital-to-analog converter is configured by efficiently disposing the high-order switches and signal lines as shown in FIG. 9, voltages developed across two or more consecutive unit resistors are used as the high-potential reference voltage and low-potential reference voltage of a low-order digital-to-analog converter. Therefore, the differential linearity error can be reduced, as is the case with the first to third exemplary embodiments, by controlling the high-order switches and low-order switches in such a manner that a bend is included in two or more consecutive unit resistors.

It is to be understood that the present invention is not limited to the exemplary embodiments described above, but that various changes and modifications may be made without departing from the spirit and the scope of the present invention. For example, although the first to third exemplary embodiments use a 10-bit digital input signal 20 and the fourth exemplary embodiment uses a 6-bit digital input signal 20, the digital input signal 20 may include any number of bits. Further, the number of bits in the high-order bit data and low-order bit data is not limited to those mentioned in connection with the foregoing exemplary embodiments.

What is claimed is:

1. A resistor string digital-to-analog converter comprising:
    a high-order resistor string that generates a plurality of high-order analog voltages, which are obtained by dividing a first reference voltage and a second reference voltage with unit resistors, and outputs the high-order analog voltages from a plurality of voltage acquisition points coupled through one or more of the unit resistors;
    first high-order switches that are provided for the voltage acquisition points on a one-to-one basis, the conduction state of the first high-order switches being controlled in accordance with a first high-order control signal;
    a high-order decoder that generates the first high-order control signal in accordance with the value of a high-order bit of a digital input signal, which indicates one value with a plurality of bits, and brings a pair of the first high-order switches into conduction in accordance with the first high-order control signal;
    a low-order decoder that generates a low-order control signal corresponding to a value containing at least the lowest-order bit of the digital input signal;
    a conversion unit that outputs a voltage between a pair of analog voltage values, which are obtained through the pair of the first high-order switches, in accordance with the low-order control signal;

wherein the high-order decoder brings into conduction a pair of the first high-order switches corresponding to a high-order analog voltage output from the voltage acquisition points adjacent to each other through one or more of the voltage acquisition points.

2. The resistor string digital-to-analog converter according to claim 1,
wherein, when the resistance value of the unit resistors coupled between the pair of voltage acquisition points and the voltage acquisition points adjacent to the pair of voltage acquisition points are in error, the high-order decoder brings into conduction the pair of the first high-order switches corresponding to the high-order analog voltage in such a manner that the unit resistors in error are included between the pair of voltage acquisition points.

3. The resistor string digital-to-analog converter according to claim 1,
wherein the high-order decoder generates the first high-order control signal in accordance with the high-order bit and with the lowest-order bit of the digital input signal; and wherein, when the pair of voltage acquisition points are coupled through one of the voltage acquisition points, the high-order decoder brings into conduction the pair of the first high-order switches coupled to voltage acquisition points adjacent to each other through the voltage acquisition point corresponding to the value of the high-order bit if the value of the digital input signal is an even number or the unit resistor coupled to the voltage acquisition point corresponding to the value of the high-order bit is in error, and brings into conduction the pair of the first high-order switches that are coupled to the voltage acquisition point corresponding to the value of the high-order bit and coupled to a voltage acquisition point coupled to a voltage acquisition point through the voltage acquisition point corresponding to the value of the high-order bit if the value of the digital input signal is an odd number.

4. The resistor string digital-to-analog converter according to claim 1,
wherein the high-order decoder outputs a second high-order control signal in accordance with the value of the digital input signal, and
wherein the resistor string digital-to-analog converter further comprises:
a second high-order switch that selects the pair of analog voltages in accordance with the second high-order control signal and forwards the selected analog voltages to the conversion unit.

5. The resistor string digital-to-analog converter according to claim 4, further comprising:
a plurality of signal lines that couple, when the high-order resistor string is bent multiple times, a first voltage acquisition point to a second voltage acquisition point, which is a voltage acquisition point adjacent to the first voltage acquisition point in a direction perpendicular to the direction of a resistor row of the high-order resistor string and differs from a voltage acquisition point adjacent to the voltage acquisition point in the direction of a resistor row of the high-order resistor string;
wherein the second high-order switch selects the pair of analog voltages output from the signal lines and forwards the selected analog voltages to the conversion unit.

6. The resistor string digital-to-analog converter according to claim 1, wherein the conversion unit is a low-order resistor string digital-to-analog converter that includes:
a low-order resistor string, which generates a plurality of low-order analog voltages obtained by dividing the pair of analog voltages and outputs the low-order analog voltages from a plurality of low-order voltage acquisition points; and
low-order switches, which are provided for the low-order voltage acquisition points on a one-to-one basis, the conduction state of the low-order switches being controlled in accordance with the low-order control signal.

7. The resistor string digital-to-analog converter according to claim 1,
wherein the conversion unit is an interpolating amplifier that outputs an output voltage in accordance with the low-order control signal, the output voltage being obtained by dividing the pair of analog voltages.

* * * * *